(12) United States Patent
Shi et al.

(10) Patent No.: US 12,464,913 B2
(45) Date of Patent: Nov. 4, 2025

(54) DISPLAY APPARATUS AND MANUFACTURING METHOD THEREOF

(71) Applicants: Chengdu BOE Optoelectronics Technology Co., Ltd., Sichuan (CN); BOE Technology Group Co., Ltd., Beijing (CN)

(72) Inventors: Jiafan Shi, Beijing (CN); Xuewei Tian, Beijing (CN); Changchang Liu, Beijing (CN); Yuanzheng Guo, Beijing (CN); Xiaoqi Ding, Beijing (CN); Liqiang Chen, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/025,385

(22) PCT Filed: Jun. 30, 2022

(86) PCT No.: PCT/CN2022/102871
§ 371 (c)(1),
(2) Date: Mar. 8, 2023

(87) PCT Pub. No.: WO2024/000422
PCT Pub. Date: Jan. 4, 2024

(65) Prior Publication Data
US 2024/0298483 A1    Sep. 5, 2024

(51) Int. Cl.
*H10K 59/131*    (2023.01)
*H10K 59/12*     (2023.01)
(Continued)

(52) U.S. Cl.
CPC ....... *H10K 59/131* (2023.02); *H10K 59/1201* (2023.02); *H10K 59/90* (2023.02); *H10K 2102/311* (2023.02)

(58) Field of Classification Search
None
See application file for complete search history.

(56) References Cited

U.S. PATENT DOCUMENTS

2022/0399524 A1    12/2022    Jia et al.
2024/0276836 A1*   8/2024     Zeng ............... H01L 25/18

FOREIGN PATENT DOCUMENTS

CN    105228335 A    1/2016
CN    107484328 A    12/2017
(Continued)

*Primary Examiner* — Kyoung Lee
(74) *Attorney, Agent, or Firm* — IPro, PLLC

(57) ABSTRACT

A display apparatus includes a driving chip, a flexible circuit board and a display panel. The display panel includes a display portion and a bonding portion on one side of the display portion, and the bonding portion includes a first bending portion, a first connection portion, a second bending portion and a second connection portion which are sequentially arranged in a direction with an increasing extending distance from the display portion. The driving chip is in bonding connection with the display panel in the first connection portion, the flexible circuit board is in bonding connection with the display panel in the second connection portion, the driving chip is disposed on a side of the first connection portion facing away from the display portion, and the flexible circuit board is disposed on a side of the driving chip facing away from the display portion.

15 Claims, 6 Drawing Sheets

(51) Int. Cl.
*H10K 59/90* (2023.01)
*H10K 102/00* (2023.01)

(56) References Cited

FOREIGN PATENT DOCUMENTS

| | | |
|---|---|---|
| CN | 109240013 A | 1/2019 |
| CN | 113066832 A | 7/2021 |
| CN | 113725232 A | 11/2021 |
| CN | 215187554 U | 12/2021 |

* cited by examiner

DISPLAY APPARATUS AND MANUFACTURING METHOD THEREOF

CROSS REFERENCE TO RELATED APPLICATIONS

This application is a national phase entry under 35 U.S.C. § 371 of International Application No. PCT/CN2022/102871, filed on Jun. 30, 2022, the entire content of which is incorporated herein by reference.

FIELD

The disclosure relates to the field of display technology, in particular to a display apparatus and a manufacturing method thereof.

BACKGROUND

A flexible organic light emitting diode (OLED) has a characteristic of being bendable, and is widely applied to rigid phones, folding products, wearable products and other electronic products. In order to improve battery life of the electronic products, a battery capacity needs to be increased, and accordingly more space for battery installation is needed. How to provide more space for batteries in the limited space of the electronic products to improve the battery capacity has become an urgent technical issue.

SUMMARY

The disclosure provides a display apparatus and a manufacturing method thereof, which is used for saving a transverse space of a whole machine.

In a first aspect, an embodiment of the disclosure provides a display apparatus, including: a driving chip, a flexible circuit board and a display panel. The display panel includes a display portion and a bonding portion on one side of the display portion, and the bonding portion includes a first bending portion, a first connection portion, a second bending portion and a second connection portion which are sequentially arranged in a direction with an increasing extending distance from the display portion. The first connection portion is located on a back face of the display portion, the second connection portion is located on a side of the first connection portion facing away from the display portion, the driving chip is in bonding connection with the display panel in the first connection portion, the flexible circuit board is in bonding connection with the display panel in the second connection portion, the driving chip is arranged on a side of the first connection portion facing away from the display portion, and the flexible circuit board is located on one side of the driving chip facing away from the display portion. The display panel includes a flexible substrate, and at least one insulating layer and at least one metal layer on the flexible substrate. The at least one insulating layer and the at least one metal layer both have no pattern in the first bending portion and the second bending portion; and the flexible substrate includes a first flexible substrate layer, a base metal layer and a second flexible substrate layer which are sequentially disposed in stack, and the at least one metal layer is coupled with the base metal layer through a via hole running through the at least one insulating layer.

In some embodiments, the flexible substrate further includes a supporting layer disposed on a side of the second flexible substrate layer facing away from the first flexible substrate layer.

In some embodiments, the display panel is provided with a groove structure with a channel running through the supporting layer both in the first bending portion and the second bending portion.

In some embodiments, an element portion is disposed on a side of the flexible circuit board facing away from the display portion, and the element portion is configured to be coupled with at least one element.

In some embodiments, the display apparatus further includes an adhesive between the first connection portion and the flexible circuit board, and the adhesive is disposed around the driving chip.

In some embodiments, an orthographic projection of the driving chip on the display portion overlaps an orthographic projection of the element portion on the display portion, and in a direction from the first connection portion to the element portion, a thickness of the adhesive is greater than a height of the driving chip.

In some embodiments, an orthographic projection of the driving chip on the display portion does not overlap an orthographic projection of the element portion on the display portion, and the element portion is arranged on a side of the driving chip facing away from the second connection portion.

In some embodiments, in a direction from the first connection portion to the flexible circuit board, the flexible circuit board further includes an open hole running through a thickness direction, and the open hole is used for accommodating the driving chip.

In some embodiments, in the direction from the first connection portion to the flexible circuit board, a thickness of the adhesive is smaller than a height of the driving chip, and the height of the driving chip is smaller than a depth of the open hole.

In a second aspect, an embodiment of the disclosure further provides a manufacturing method of the above display apparatus. The method includes: connecting a driving chip with a display panel in a bonding mode through a first connection portion; connecting a flexible circuit board with the display panel in a bonding mode through a second connection portion; bringing the first connection portion, a second bending portion and the second connection portion to a back face of a display portion by bending in a first bending portion; and bringing the second connection portion to a side of the first connection portion facing away from the display portion by bending in the second bending portion.

DETAILED DESCRIPTION

Figure 1:
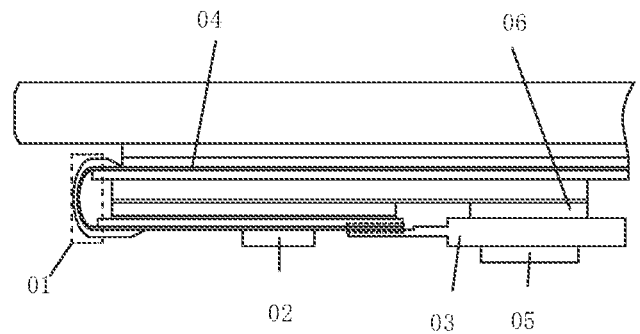
FIG. 1 is a schematic structural diagram of a flexible OLED module structure in the related art.

To make objectives, technical solutions and advantages of embodiments of the disclosure clearer, the technical solutions of the embodiments of the disclosure will be clearly and completely described below in conjunction with accompanying drawings of the embodiments of the disclosure. Apparently, the described embodiments are only a part of the embodiments of the disclosure, not all of the embodiments. The embodiments in the disclosure and features in the embodiments can be combined with each other in the case of not conflicting.

Based on the described embodiments of the disclosure, all other embodiments obtained by those ordinarily skilled in the art without creative work shall fall within the protection scope of the disclosure.

Unless otherwise indicated, technical or scientific terms used in the disclosure shall have the ordinary meanings understood by those ordinarily skilled in the art to which the disclosure pertains. The words "comprise" or "include" and the like used in the disclosure indicate that an element or item appearing before such word covers listed elements or items appearing after the word and equivalents thereof, and does not exclude other elements or items.

It needs to be noted that sizes and shapes of all figures in the accompanying drawings do not reflect true scales, and are only intended to schematically illustrate the content of the disclosure. The same or similar reference numerals represent the same or similar elements or elements with the same or similar functions all the time.

In the related art, a flexible OLED module structure shown in FIG. 1 is usually used. Reference sign 01 represents a bending portion, reference sign 02 represents an integrated circuit (IC) chip, reference sign 03 represents a flexible printed circuit (FPC), reference sign 04 represents a display screen, reference sign 05 represents a device arranging portion, and reference sign 06 represents an FPC adhesive. In this structure, by using a bendable performance of the flexible display screen, the IC 02 and the FPC 03 are disposed on a back face of the display screen 04 by bending the module structure in the bending portion 01. A battery is usually arranged on one side of the device arranging portion 05 of the FPC 03 facing away from the display screen 04. Since a plane where the FPC 03 is located may overlap a battery space, a thickness of the battery is limited. Especially, the FPC 03 includes the device arranging portion 05, the FPC adhesive 06 and the like, the overall thickness may reach 1 mm-3 mm, correspondingly, the battery needs to be decreased by 1 mm-3 mm in thickness, and the capacity is limited.

Figure 2:
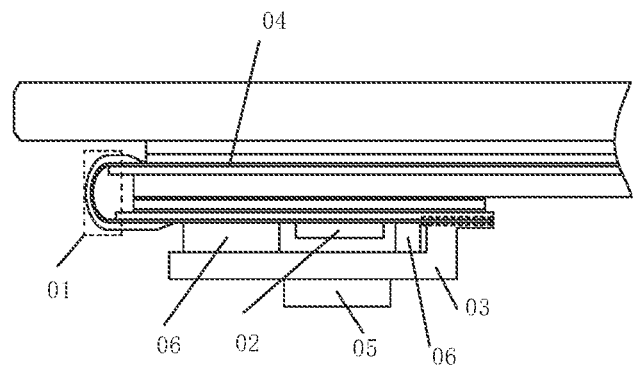
FIG. 2 is a schematic structural diagram of a flexible OLED display module provided by the inventor.

The inventor(s) found that a structure shown in FIG. 2 may be used for bonding the FPC 03 reversely, and the FPC 03 is bonded to a position of the IC 02, so as to give space to the battery space. However, this reverse bonding process is difficult, specifically, the FPC adhesive 06 needs to be exposed before bonding, and in an alignment process, the exposed FPC adhesive 06 may interfere with the IC 02 and its surrounding portions, which has the risk of early bonding and affects a bonding accuracy.

In view of this, embodiments of the disclosure provide a display apparatus and a manufacturing method thereof, which is used for saving a transverse space of a whole device while taking into account the trace layout, and improves a use performance of the display apparatus.

Figure 3:
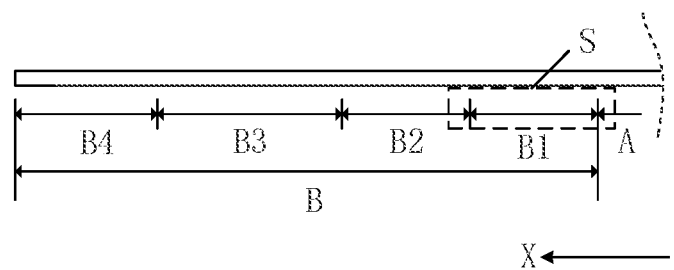
FIG. 3 is a schematic structural diagram of a structure with a first bending portion and a second bending portion in a display panel provided by an embodiment of the disclosure in a non-bending state.
Figure 4:
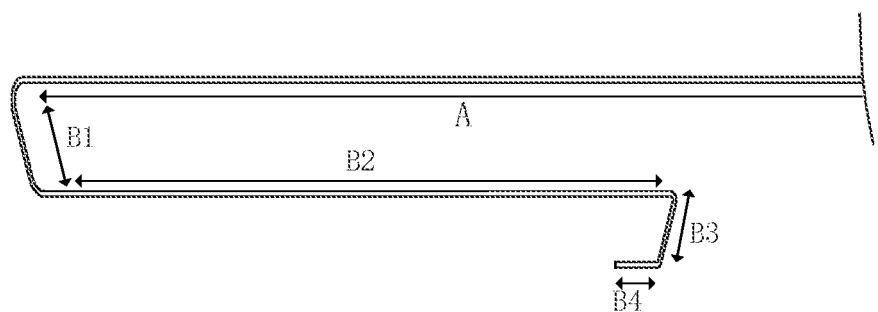
FIG. 4 is a schematic structural diagram of a structure with a first bending portion and a second bending portion in a display panel provided by an embodiment of the disclosure in a bending state.

In embodiments of the disclosure, in order to more clearly describe the structure of the display apparatus provided by the embodiment of the disclosure, the display panel included in the display apparatus provided by the embodiment of the disclosure is briefly described. As shown in FIG. 3 and FIG. 4, FIG. 3 is a schematic structural diagram of a structure with a first bending portion B1 and a second bending portion B3 in a display panel provided by an embodiment of the disclosure in a non-bending state, and FIG. 4 is a schematic structural diagram of a structure with a first bending portion B1 and a second bending portion B3 in a display panel provided by an embodiment of the disclosure in a bending state. Specifically, the display panel includes:

a display portion A and a bonding portion B located on a side of the display portion A, and the bonding portion B includes a first bending portion B1, a first connection portion B2, a second bending portion B3 and a second connection portion B4 which are sequentially arranged in a direction with an increasing extending distance from the display portion A;

the first connection portion B2 is on a back face of the display portion A, the second connection portion B4 is located at a side of the first connection portion B2 facing away from the display portion A, the first connection portion B2 is configured to be coupled with a driving chip, and the second connection portion B4 is configured to be coupled with a flexible circuit board.

Still as shown in FIG. 3 and FIG. 4, the display panel includes a display portion A and a bonding portion B located on a side of the display portion A, and the bonding portion B includes a first bending portion B1, a first connection portion B2, a second bending portion B3 and a second connection portion B4 which are sequentially arranged in a direction with an increasing extending distance from the display portion A. A direction indicated by an arrow X is the direction with an increasing extending distance from the display portion A. Of course, the layout of the display portion A as well as the first bending portion B1, the first connection portion B2, the second bending portion B3 and the second connection portion B4 in the bonding portion B may further be arranged according to requirements of actual applications, which is not limited here.

Still as shown in FIG. 4, the first connection portion B2 is located on the back face of the display portion A, and the second connection portion B4 is located at one side of the first connection portion B2 facing away from the display portion A. The first connection portion B2, the second bending portion B3 and the second connection portion B4 as shown in FIG. 3 may be brought to the back face of the display portion A by folding in the first bending portion B1. Further, the second connection portion B4 is brought to be located at the side of the first connection portion B2 facing away from the display portion A by folding in the second bending portion B3. In this way, compared with FIG. 1, the structural design of twice reverse folds of the display panel in the first bending portion B1 and the second bending portion B3 in embodiments of the disclosure saves the transverse space of the display panel.

In embodiments of the disclosure, the display panel includes a flexible substrate 10, and at least one insulating layer and at least one metal layer which are disposed on the flexible substrate 10.

The at least one insulating layer and the at least one metal layer both have no pattern in the first bending portion B1 and the second bending portion B3.

The flexible substrate 10 includes a first flexible substrate layer, a base metal layer 102 and a second flexible substrate layer which are sequentially disposed in stack, and the at least one metal layer is coupled with the base metal layer 102 through a via hole running through the at least one insulating layer.

Figure 5:
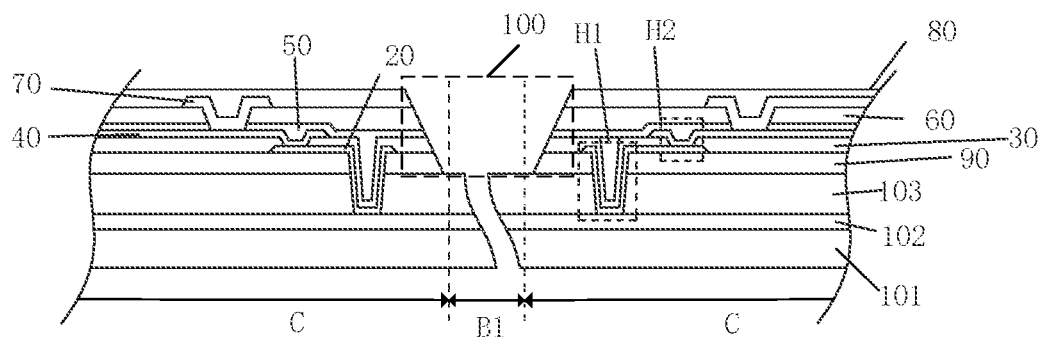
FIG. 5 is a schematic cross-sectional view of a portion S in FIG. 3.
Figure 6:
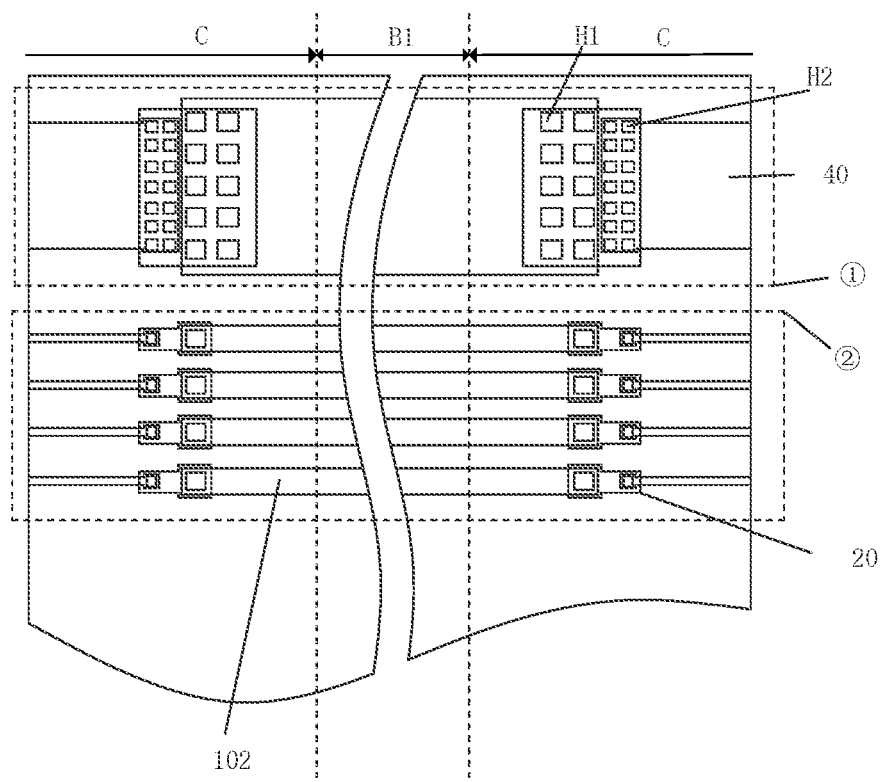
FIG. 6 is a schematic top view of the portion S in FIG. 3.

As shown in FIG. 5 and FIG. 6, FIG. 5 shows a schematic cross-sectional view of a portion S in FIG. 3, and FIG. 6 is a schematic top view of the portion S in FIG. 3. In some embodiments, the display panel includes the flexible substrate 10, and at least one insulating layer and at least one metal layer on the flexible substrate 10. The at least one insulating layer may be manufactured in the same layer as a relevant insulating layer located in the display portion A, and the at least one metal layer may be manufactured in the same layer as a relevant metal layer located in the display portion A. The at least one insulating layer may be at least one of a first gate insulating layer, a second gate insulating layer, an interlayer insulating layer 30, a passivation layer 50, a planarization layer or other insulating layers. The at least one metal layer may be at least one of a first source-drain electrode layer 40, a second source-drain electrode layer 70 or other metal layers. Of course, the at least one insulating layer and the at least one metal layer may further be arranged according to the requirements of the actual applications, which is not limited here.

In some embodiments, still as shown in FIG. 5, besides the flexible substrate 10, the display panel includes a second gate layer 102, an interlayer insulating layer 30, a first source-drain electrode layer 40, a passivation layer 50, a first planarization layer 60, a second source-drain electrode layer 70 and a second planarization layer 80. Of course, the relevant film layers in the display panel may further be arranged according to the requirements of the actual applications, such as an anode layer, a light emitting layer, a pixel defining layer and a cathode layer, and a specific arrangement mode may be implemented by referring to the related art, which will not be detailed here.

In some embodiments, the at least one insulating layer and the at least one metal layer both have no pattern in the first bending portion B1 and the second bending portion B3. In some embodiments, the parts of the at least one insulating layer and the at least one metal layer in the first bending portion B1 and the second bending portion B3 may be removed through exposure and etching processes. In this way, the display panel may have groove structures with channel running through the at least one insulating layer and the at least one metal layer in corresponding portions of the first bending portion B1 and the second bending portion B3, so that a bending performance of the display panel in the first bending portion B1 and the second bending portion B3 is ensured.

Still as shown in FIG. 5, the flexible substrate 10 includes a first flexible substrate layer 101, a base metal layer 102 and a second flexible substrate layer 103 which are sequentially disposed in stack, and the at least one metal layer is coupled with the base metal layer 102 through a via hole (as shown in dotted boxes H1 and H2 in FIG. 5) running through the at least one insulating layer. In this way, lines in a bending portion may be directly arranged on the base metal layer 102 between the first flexible substrate layer 101 and the second flexible substrate layer 103. A thickness of the first flexible substrate layer 101 and the second flexible substrate layer 103 may be 5 μm-10 μm. Materials of the first flexible substrate layer 101 and the second flexible substrate layer 103 may be at least one of polyimide (PI), polyethylene terephthalate (PET) or polycarbonate (PC). The materials of the first flexible substrate layer 101 and the second flexible substrate layer 103 may be the same, and for example, the two both are PI; or the materials may further be different, for example, the first flexible substrate layer 101 is PI, and the second flexible substrate layer 103 is PET. Of course, those skilled in the art may further select the materials of the first flexible substrate layer 101 and the second flexible substrate layer 103 according to the requirements of the actual applications, which is not limited here. In this way, an elongation-to-break of the first flexible substrate layer 101 and the second flexible substrate layer 103 is high, and even when the first bending portion B1 and the second bending portion B3 are bent, no breaking will occur.

In addition, the base metal layer 102 may be a film layer made of a metal material with a good conductivity, such as copper. Moreover, the base metal layer 102 is located between the first flexible substrate layer 101 and the second flexible substrate layer 103, and is essentially a stress neutral layer. Even when the first bending portion B1 and the second bending portion B3 are bent, the base metal layer 102 is subjected to a small stress, and the bending performance of the display panel is ensured. The inventor(s) found that the strain of the base metal layer 102 is smaller than 10% of its breaking threshold when a bending radius is 0.05 mm through analog simulation. In addition, in some embodiments, a protective adhesive does not need to be additionally arranged in the first bending portion B1 and the second bending portion B3, small radius bending of the display panel is ensured, and for example, a bending radius is smaller than 0.1 mm. In this way, through the flexible substrate 10 provided by the embodiment of the disclosure, a purpose that smaller radius bending is realized, while saving the transverse space by the twice reverse fold.

In some embodiments, in order to apply an electric signal to corresponding metal trace of the base metal layer 102 and ensure the use performance of the display panel, a perforation portion C may be formed in a portion near the first bending portion B1 and the second bending portion B3, and the relevant film layers are perforated in the perforation portion C. In some embodiments, a distribution of the formed via holes may be shown as in FIG. 5 and FIG. 6, where H1 represents a via hole running through a supporting layer 90 and the second flexible substrate layer 103, and H2 represents a via hole running through the interlayer insulating layer 30. In FIG. 6, a portion ① may be used for laying out power supply lines, such as high-potential line VDD, and low-potential line VSS. A portion ② may be used for laying out driving signal lines, and may further be used for laying out control signal lines, such as data signal lines, and clock signal lines. Of course, the layout of the holes and lines may be performed according to the requirements of the actual applications, which is not limited here.

It should be noted that in the display panel provided by the embodiment of the disclosure, the at least one insulating layer and the at least one metal layer both have no pattern in the first bending portion B1 and the second bending portion B3. In an actual preparing process, in the first bending portion B1 and the second bending portion B3, only the first flexible substrate layer 101, the base metal layer 102 and the second flexible substrate layer 103 may be reserved, and the relevant insulating layers and metal layers that are not bendable in the portions may be removed through the exposure and etching processes, so that the bending performance of the display panel is improved.

In embodiments of the disclosure, the flexible substrate 10 further includes a supporting layer 90 disposed on a side of the second flexible substrate layer 103 facing away from the first flexible substrate layer 101.

Still as shown in FIG. 5, the flexible substrate 10 further includes the supporting layer 90 disposed on a side of the second flexible substrate layer 103 facing away from the first flexible substrate layer 101. The supporting layer 90 may be a film layer made of inorganic insulating materials such as silicon oxide and silicon nitride, or may be a film layer made of inorganic materials such as PI. The erosion of water and oxygen to the base metal layer 102 is effectively isolated, the flatness of a subsequent film layer structure is ensured, and a manufacturing efficiency of the display panel is improved.

In embodiments of the disclosure, the display panel is provided with a groove structure 100 with a channel running through the supporting layer 90 both in the first bending portion B1 and the second bending portion B3.

Still as shown in FIG. 5, the display panel is provided with the groove structures 100 with a channel running through the supporting layer 90 both in the first bending portion B1 and the second bending portion B3, and orthographic projections of the first bending portion B1 and the second bending portion B3 on the flexible substrate 10 completely fall into a portion range of orthographic projections of the groove structures 100 on the flexible substrate 10. In this way, the bending performance of the display panel in the first bending portion B1 and the second bending portion B3 is ensured, and the manufacturing efficiency of the display panel is improved.

It should be noted that in order to ensure the layout of relevant wiring in the display panel, the preparing process of the display panel corresponding to FIG. 5 may be that the flexible substrate 10 and the supporting layer 90 are sequentially formed; a pattern of an active layer is formed on a side of the supporting layer 90 facing away from the base metal layer 102; in the perforation portion C, via holes running through the supporting layer 90 and the second flexible substrate layer 103 are sequentially formed; then, the first gate insulating layer, the first gate layer, the second gate insulating layer, the second gate layer 102 and the interlayer insulating layer 30 are deposited; a via hole running through the interlayer insulating layer 30 is formed; the first source-drain electrode layer 40, the passivation layer 50 and the first planarization layer 60 are deposited; a via hole running through the first planarization layer 60 is formed; the second source-drain electrode layer is deposited; the second planarization layer 80 is deposited; and subsequently, preparation of a light emitting function layer and an encapsulation function layer is performed. The specific preparation process may be implemented by referring to the related art, which will not be detailed here. Since the relevant film layers shown in FIG. 5 are structures in the perforation portion C near the first bending portion B1 or the second bending portion B3, a corresponding portion is usually not provided with the active layer, the first gate insulating layer, the second gate insulating layer and the first gate layer, and thus these film layer structures are not shown in the figure. Of course, the relevant film layers of the first bending portion B1 and the second bending portion B3 may further be arranged according to the requirements of the actual applications, which will not be detailed here.

Figure 7:
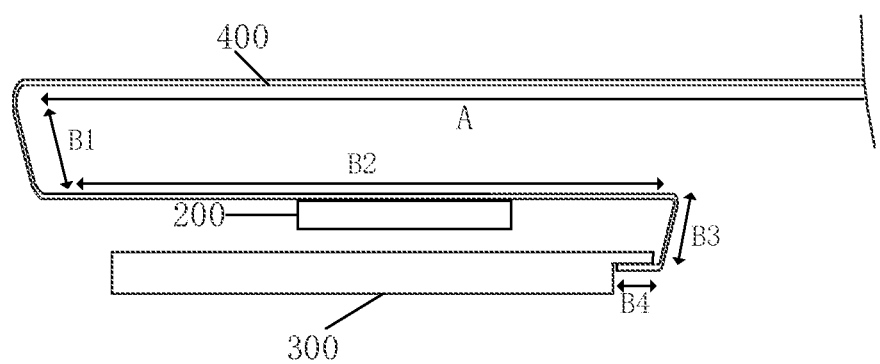
FIG. 7 is a schematic structural diagram of a display apparatus provided by an embodiment of the disclosure.

Based on the same inventive concept, as shown in FIG. 7 and FIG. 5, an embodiment of the disclosure further provides a display apparatus, including:
- a driving chip 200, a flexible circuit board 300 and a display panel 400; where
- the display panel 400 includes a display portion A and a bonding portion B located on a side of the display portion A, and the bonding portion B includes a first bending portion B1, a first connection portion B2, a second bending portion B3 and a second connection portion B4 which are sequentially arranged in a direction with an increasing extending distance from the display portion A;
- the first connection portion B2 is located on a back face of the display portion A, the second connection portion B4 is located on a side of the first connection portion B2 facing away from the display portion A, the driving chip 200 is in bonding connection with the display panel 400 in the first connection portion B2, the flexible circuit board 300 is in bonding connection with the display panel 400 in the second connection portion B4, the driving chip 200 is arranged on a side of the first connection portion B2 facing away from the display portion A, and the flexible circuit board 300 is located at a side of the driving chip 200 facing away from the display portion A;
- the display panel 400 includes a flexible substrate 10, and at least one insulating layer and at least one metal layer which are disposed on the flexible substrate 10; the at least one insulating layer and the at least one metal layer both have no pattern in the first bending portion B1 and the second bending portion B3; and the flexible substrate 10 includes a first flexible substrate layer, a base metal layer 102 and a second flexible substrate layer which are sequentially disposed in stack, and the at least one metal layer is coupled with the base metal layer 102 through a via hole running through the at least one insulating layer.

It should be noted that a specific structure of the display panel 400 included in the display apparatus provided by the embodiment of the disclosure may refer to the description in the preceding section, which will not be detailed here. In addition, the principle for solving problems of the display apparatus provided by the embodiment of the disclosure is similar to that of the above display panel 400, therefore, the implementation of the display apparatus may refer to that of the above display panel 400, and repetitions will not be made.

Still as shown in FIG. 7, the display apparatus in embodiments of the disclosure includes a driving chip 200, a flexible circuit board 300 and a display panel 400. The driving chip 200 is in bonding connection with the display panel 400 in the first connection portion B2, and the flexible circuit board 300 is in bonding connection with the display panel 400 in the second connection portion B4, so that a display function of the display panel 400 is ensured. In addition, the driving chip 200 is disposed on a side of the first connection portion B2 facing away from the display portion A, the flexible circuit board 300 is disposed on a side of the driving chip 200 facing away from the display portion A, so that the transverse space of the display apparatus is saved, and a guarantee is provided for subsequent installation of large-capacity batteries.

In addition, still as shown in FIG. 5, the display panel 400 in the display apparatus provided by the embodiment of the disclosure includes a flexible substrate 10, and at least one insulating layer and at least one metal layer which are disposed on the flexible substrate 10; the at least one insulating layer and the at least one metal layer both have no pattern in the first bending portion B1 and the second bending portion B3; and the flexible substrate 10 includes a first flexible substrate layer 101, a base metal layer 102 and a second flexible substrate layer 103 which are sequentially disposed in stack, and the at least one metal layer is coupled with the base metal layer 102 through a via hole running through the at least one insulating layer. In this way, the bending performance of the display panel 400 is ensured, meanwhile the layout of relevant wiring of the display apparatus is ensured, and the use performance of the display apparatus is improved.

In some embodiments, still as shown in FIG. 5, the flexible substrate 10 further includes a supporting layer 90 disposed on a side of the second flexible substrate layer 103 facing away from the first flexible substrate layer 101. The supporting layer 90 may be a film layer made of inorganic insulating materials such as silicon oxide and silicon nitride, or may be a film layer made of inorganic materials such as PI, the erosion of water and oxygen on the base metal layer 102 is effectively isolated, meanwhile the flatness of a subsequent film layer structure is ensured, and a manufacturing yield of the display apparatus is improved. Moreover, still as shown in FIG. 5, the display panel 400 is provided with groove structures 100 with a channel running through the supporting layer 90 both in the first bending portion B1 and the second bending portion B3. Orthographic projections of the first bending portion B1 and the second bending portion B3 on the flexible substrate 10 completely fall into a portion range of orthographic projections of the groove structures 100 on the flexible substrate 10. In this way, the bending performance of the display panel 400 in the first bending portion B1 and the second bending portion B3 is ensured, and the manufacturing yield of the display apparatus is improved.

It should be noted that a specific structure of the display panel 400 in FIG. 5 may refer to the description in the preceding relevant section, which will not be detailed here.

In embodiments of the disclosure, an element portion D is disposed on a side of the flexible circuit board 300 facing away from the display portion A, and the element portion D is configured to be coupled with at least one element.

Figure 8:
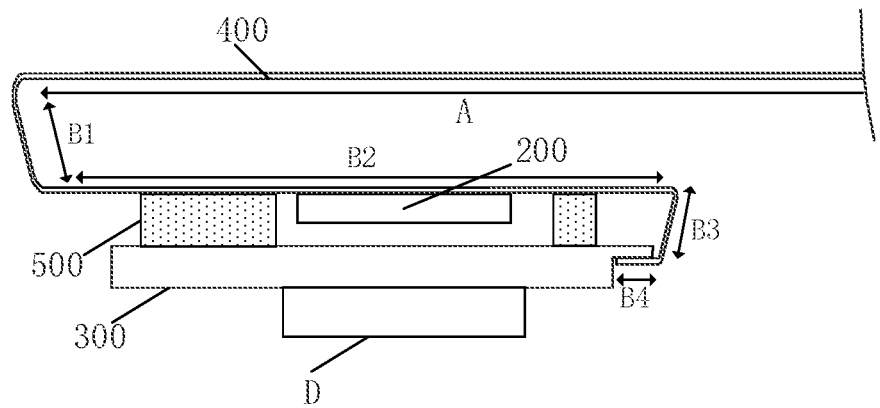
FIG. 8 is a schematic structural diagram of a display apparatus provided by an embodiment of the disclosure.

As shown in FIG. 8, the element portion D is disposed on the side of the flexible circuit board 300 facing away from the display portion A, and the element portion D is configured to be coupled with at least one element. The at least one element may be at least one of a resistor, a capacitor or an inductor. Of course, the at least one element may be arranged according to the actual applications, which is not limited here.

In embodiments of the disclosure, the display apparatus further includes an adhesive 500 between the first connection portion B2 and the flexible circuit board 300, and the adhesive 500 is disposed around the driving chip 200.

Still as shown in FIG. 8, the display apparatus further includes the adhesive 500 between the first connection portion B2 and the flexible circuit board 300, and the adhesive 500 may be disposed on a back face of the flexible circuit board 300, that is, it is disposed on the side of the flexible circuit board 300 facing the display portion A. In addition, the adhesive 500 is disposed around the driving chip 200, so that a stable connection between the flexible circuit board 300 and the display panel 400 is ensured, and the use performance of the display apparatus is ensured.

It should be noted that the display apparatus provided by the embodiment of the disclosure may further include other film layer structures in addition to the film layers mentioned above. As shown in FIG. 9 to FIG. 12, the display apparatus provided by the embodiment of the disclosure further includes a back film 600 disposed on a back face of the display portion A, a back face of the first connection portion B2 and a back face of the second connection portion B4, so that a supporting performance of the display panel 400 is ensured. The display apparatus further includes a cooling fin 700 disposed on a side of the back film 600 facing away from the display portion A, so that a cooling efficiency of the display apparatus is ensured, and the use performance of the display apparatus is improved. In some embodiments, the cooling fin 700 may be of a composite cooling structure composed of a grid adhesive, foam and copper foil. The display apparatus further includes a double-sided adhesive 800 disposed on a side of the cooling fin 700 facing away from the display portion A, and the double-sided adhesive 800 is located between the cooling fin 700 and the back film 600 on the back face of the first connection portion B2, so that the structural stability of the display apparatus is ensured. The display apparatus further includes a polarizer 900 disposed on a front face of the display portion A. On the one hand, through the polarizer 900, the reflection of the display panel 400 to external ambient light is reduced, and use experience of a user is improved; and on the other hand, the impact of the external ambient light on organic light emitting materials is avoided, service lives of the organic light emitting materials are ensured, and the use performance of the display apparatus is improved. An adhesive material layer 1000 and a cover plate 1010 may further be sequentially disposed on a side of the polarizer 900 facing away from the display panel 400. The adhesive material layer 1000 may be an optically clear adhesive (OCA), transparent display of the display apparatus is ensured, and meanwhile the structural stability of the display apparatus is ensured. In addition, the cover plate 1010 may prevent the display apparatus from being damaged, and the use performance of the display apparatus may further be improved by arranging a coating with a specific function on the cover plate 1010. The coating may be one or more of an anti-glare (AG) protective film layer, an anti-fingerprint (AF) protective film layer and an anti-ultraviolet (UV) protective film layer, which is not limited here. Of course, other film layers may further be arranged according to the requirements of the actual applications, and may be implemented by referring to the related art, which will not be detailed here.

Still as shown in FIG. 9 to FIG. 12, the following arrangement modes may be adopted between the driving chip 200 and the element portion D in the display apparatus, but it is not limited to the following arrangement modes.

Figure 9:
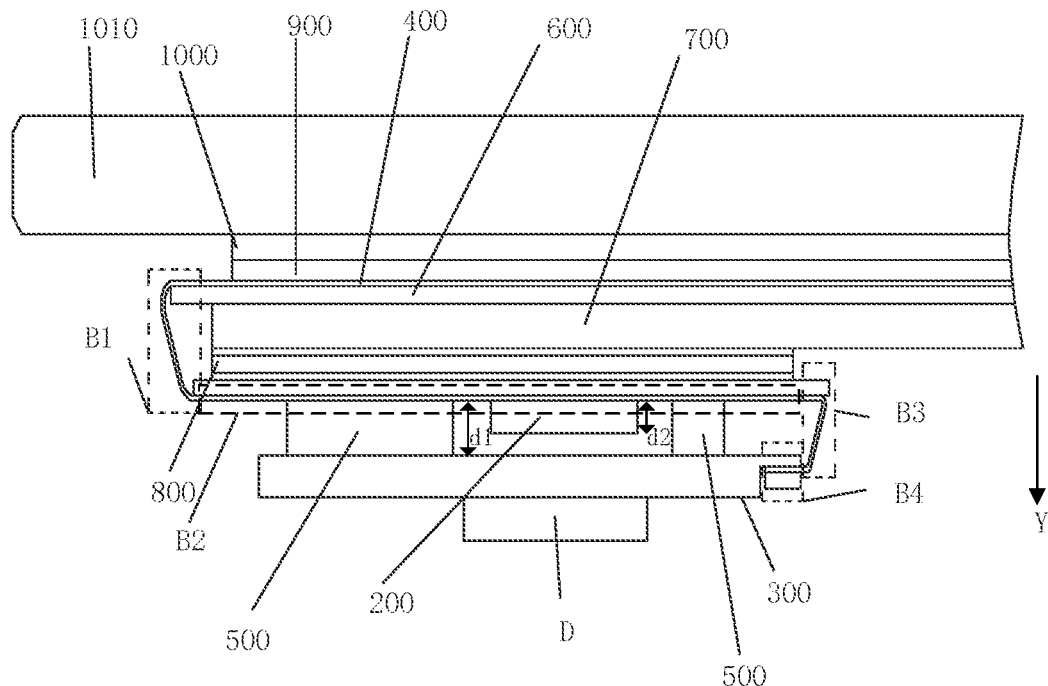
FIG. 9 is a schematic structural diagram of a display apparatus provided by an embodiment of the disclosure.

In some embodiments, still as shown in FIG. 9, an orthographic projection of the driving chip 200 on the display portion A overlaps an orthographic projection of the element portion D on the display portion A, and in a direction from the first connection portion B2 to the element portion D, a thickness of the adhesive 500 is greater than a height of the driving chip 200.

Still as shown in FIG. 9, a direction shown by an arrow Y is the direction from the first connection portion B2 to the element portion D. Accordingly, in the direction shown by the arrow Y, the thickness of the adhesive 500 is d1, the height of the driving chip 200 is d2, where d1>d2, so that effective fixation of the adhesive 500 between the display panel 400 and the flexible circuit board 300 is ensured, meanwhile the driving chip 200 is effectively avoided, damage to the driving chip 200 is avoided, and the use performance of the display apparatus is improved. For example, the thickness of the adhesive 500 is greater than 300 μm, so that a sufficient space is reserved for the driving chip 200. Of course, the specific thickness of the adhesive 500 may be set according to the requirements of the actual applications, which is not limited here.

Figure 10:
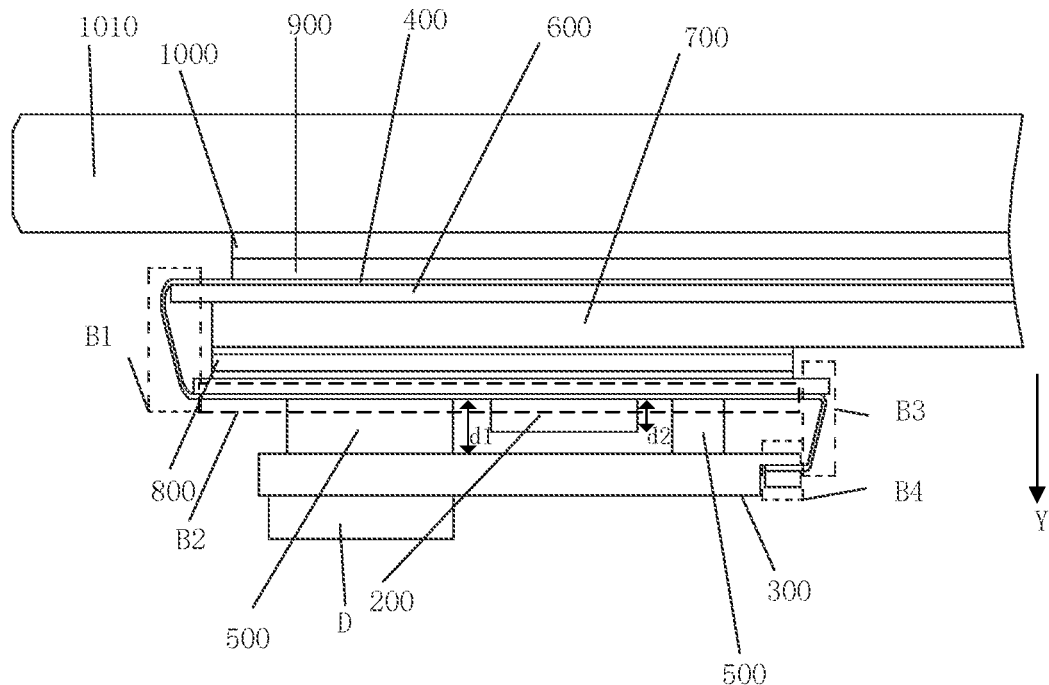
FIG. 10 is a schematic structural diagram of a display apparatus provided by an embodiment of the disclosure.
Figure 11:
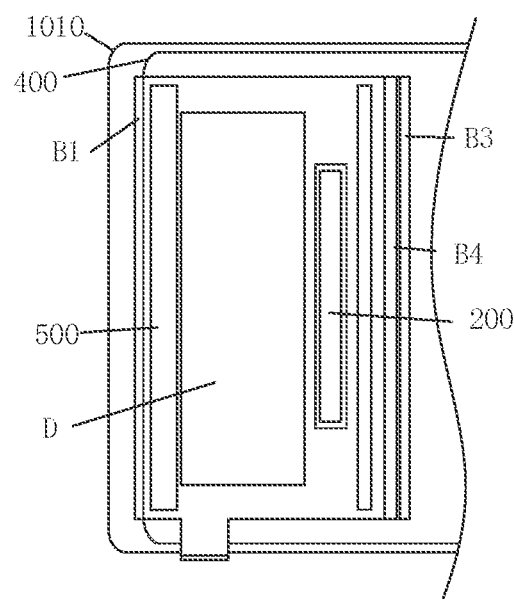
FIG. 11 is a schematic structural diagram of a display apparatus provided by an embodiment of the disclosure.

In some embodiments, as shown in FIG. 10 and FIG. 11, FIG. 11 is a schematic top view corresponding to FIG. 10. Specifically, an orthographic projection of the driving chip 200 on the display portion A does not overlap an orthographic projection of the element portion D on the display portion A, and the element portion D is disposed on a side of the driving chip 200 facing away from the second connection portion B4.

In some embodiments, the orthographic projection of the driving chip 200 on the display portion A does not overlap the orthographic projection of the element portion D on the display portion A. Taking FIG. 11 as an example, the element portion D is disposed on a left side of the driving chip 200. Moreover, the element portion D is disposed on the side of the driving chip 200 facing away from the second connection portion B4, so that the transverse space of the display apparatus is effectively saved.

Figure 12:
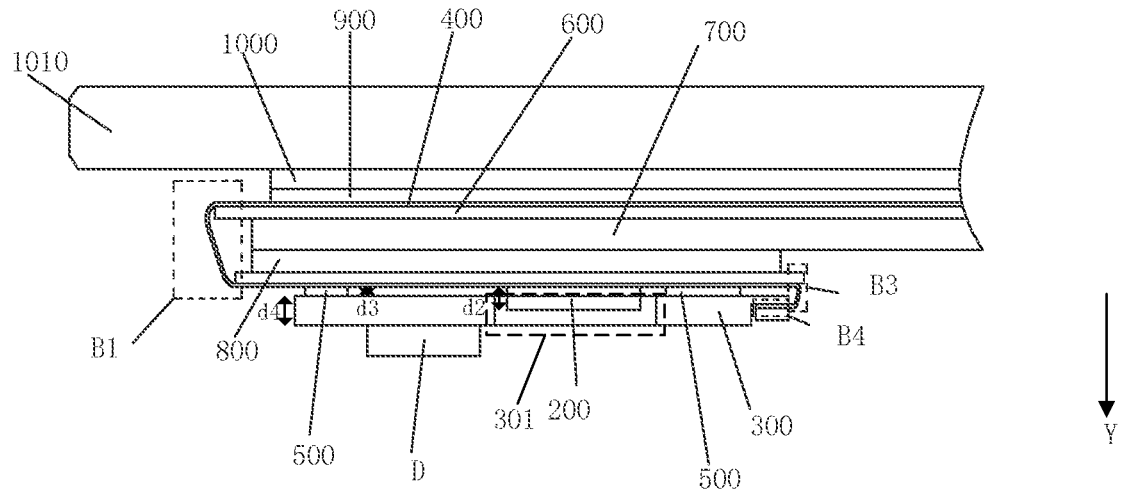
FIG. 12 is a schematic structural diagram of a display apparatus provided by an embodiment of the disclosure.

In some embodiments, as shown in FIG. 12, in a direction from the first connection portion B2 to the flexible circuit board 300, the flexible circuit board 300 further includes an open hole 301 running through a thickness direction, and the open hole 301 is used for accommodating the driving chip 200.

Still as shown in FIG. 12, a direction shown by an arrow Y is the direction from the first connection portion B2 to the flexible circuit board 300. Accordingly, in the direction shown by the arrow Y, the flexible circuit board 300 further includes the open hole 301 running through the thickness direction, and the open hole 301 is used for accommodating the driving chip 200. In this way, through the open hole 301 formed in the flexible circuit board 300, space of the driving chip 200 is effectively provided, the damage to the driving chip 200 is avoided, and the use performance of the display apparatus is ensured.

In some embodiments, still as shown in FIG. 12, in the direction from the first connection portion B2 to the flexible circuit board 300, a thickness of the adhesive 500 is smaller than a height of the driving chip 200, and the height of the driving chip 200 is smaller than a depth of the open hole 301.

Still as shown in FIG. 12, in the direction shown by the arrow Y, the thickness of the adhesive 500 is d3, the height of the driving chip 200 is d2, the depth of the open hole 301 is d4, and d3<d2<d4. In this way, the space of driving chip 200 is effectively provided, meanwhile a longitudinal space of the display apparatus is saved, and a thinning design of the display apparatus is realized. In actual applications, the thickness of the adhesive 500 may be reduced to 50 μm-100 μm, so that an overall thickness of the display apparatus is reduced. Of course, the thickness of the adhesive 500 may be set according to thickness specific parameters of the driving chip 200 and the flexible circuit board 300, which is not limited here.

It should be noted that in a process for preparing the display apparatus provided by the embodiment of the disclosure, the adhesive 500 may be attached to one side of the flexible circuit board 300 facing the element portion D in advance. In this way, only when the second bending portion B3 is bent, the adhesive 500 may have a risk of exposure. In a process for bonding connection between the second connection portion B4 and the flexible circuit board 300, the interference between the adhesive 500 and the driving chip 200 as well as the surrounding portions is avoided, and there is no problem of early bonding. Compared with the structure shown in FIG. 2, the bonding accuracy is higher.

In some embodiments, the display apparatus provided by the embodiment of the disclosure may be an OLED flexible display apparatus, and a corresponding product may be a mobile phone, a tablet computer, a television, a display, a laptop, a digital photo frame, a navigator and any product or component with a display function. Other essential components of the display apparatus shall be understood by those of ordinary skill in the art, and are omitted herein and also shall not become a restriction to the disclosure.

Figure 13:
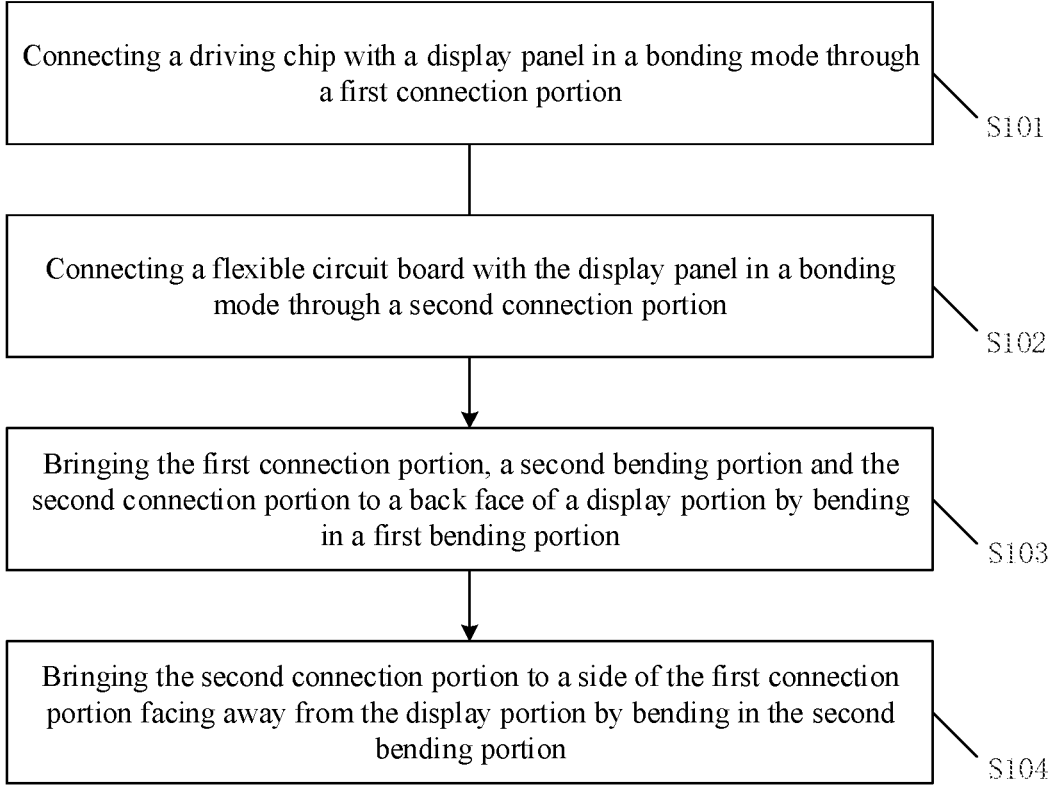
FIG. 13 is a flow chart of a manufacturing method of a display apparatus provided by an embodiment of the disclosure.

Based on the same inventive concept, as shown in FIG. 13, an embodiment of the disclosure further provides a manufacturing method of the above display apparatus, including the following.

S101: connecting a driving chip with a display panel in a bonding mode through a first connection portion.

S102: connecting a flexible circuit board with the display panel in a bonding mode through a second connection portion.

S103: bringing the first connection portion, a second bending portion and the second connection portion to a back face of a display portion by bending in a first bending portion.

S104: bringing the second connection portion to a side of the first connection portion facing away from the display portion by bending in the second bending portion.

In some embodiments, between step S101 and step S102, step S101 may be executed first, and then step S102 is executed; or step S102 may be executed first, and then step S101 is executed; or step S101 and step S102 may be executed at the same time. Of course, the execution sequence of step S101 and step S102 may further be set according to the requirements of the actual applications, which is not limited here.

In some embodiments, first, patterns of film layers of the display panel in each portion is prepared by relevant manufacturing processes; then, the driving chip is connected with the display panel in a bonding mode through the first connection portion B2; the flexible circuit board is connected with the display panel in a bonding mode through the second connection portion B4. The first connection portion B2, the second bending portion B3 and the second connection portion B4 are brought to the back face of the display portion A by bending in the first bending portion B1; and further, the second connection portion B4 is brought to the side of the first connection portion B2 facing away from the display portion A by bending in the second bending portion B3.

It should be noted that when the display apparatus shown in FIG. 12 is adopted, the open hole used for accommodating the driving chip needs to be formed in the flexible circuit board in the direction running through the thickness in advance. The manufacturing processes corresponding to the relevant film layers of the display panel may refer to the description of the above display panel, which will not be detailed here.

The embodiments of the disclosure provide the display apparatus and the manufacturing method thereof. The display apparatus includes the driving chip 200, the flexible circuit board 300 and the display panel 400; the display panel 400 includes the display portion A and the bonding portion B located on one side of the display portion A, and the bonding portion B includes the first bending portion B1, the first connection portion B2, the second bending portion B3 and the second connection portion B4 which are sequentially arranged in the direction with an increasing extending distance from the display portion A; the first connection portion B2 is located on the back face of the display portion A, the second connection portion B4 is located on the side of the first connection portion B2 facing away from the display portion A, the driving chip 200 is in bonding connection with the display panel 400 in the first connection portion B2, the flexible circuit board 300 is in bonding connection with the display panel 400 in the second connection portion B4, the driving chip 200 is disposed on one side of the first connection portion B2 facing away from the display portion A, and the flexible circuit board 300 is disposed at one side of the driving chip 200 facing away from the display portion A. That is, the display panel is folded reversely in the first bending portion B1 and the second bending portion B3 respectively, so that the first connection portion B2 is located on the back face of the display portion A, the second connection portion B4 is located at the side of the first connection portion B2 facing away from the display portion A, the driving chip 200 is located on the side of the first connection portion B2 facing away from the display portion A, the flexible circuit board 300 is located at the side of the driving chip 200 facing away from the display portion A, so that the transverse space of the display apparatus is saved, and a guarantee is provided for subsequent installation of large-capacity batteries. In addition, the display panel 400 includes the flexible substrate 10, and the at least one insulating layer and the at least one metal layer which are disposed on the flexible substrate 10, and the at least one insulating layer and the at least one metal layer both have no pattern in the first bending portion B1 and the second bending portion, so that the bending performance of the display panel is ensured. Moreover, the flexible substrate 10 includes the first flexible substrate layer 101, the base metal layer 102 and the second flexible substrate layer 103 which are sequentially disposed in stack, the at least one metal layer is coupled with the base metal layer 102 through a via hole running through the at least one insulating layer, which takes into account the layout of the relevant wiring of the display apparatus, and the use performance of the display apparatus is improved.

Although the preferred embodiments of the disclosure have been described, those skilled in the art can make additional changes and modifications on these embodiments once they know the basic creative concept. So the appended claims are intended to be construed to include the preferred embodiments and all changes and modifications that fall into the scope of the disclosure.

Obviously, those skilled in the art can make various modifications and variations to the disclosure without departing from the spirit and scope of the disclosure. In this way, if these modifications and variations of the disclosure fall within the scope of the claims of the disclosure and equivalent technologies thereof, the disclosure is also intended to include these modifications and variations.

What is claimed is:

1. A display apparatus, comprising:
  a driving chip;
  a flexible circuit board; and
  a display panel;
  wherein
  the display panel has a display portion and a bonding portion on one side of the display portion;
  the bonding portion comprises a first bending portion, a first connection portion, a second bending portion and a second connection portion which are sequentially arranged in a direction with an increasing extending distance from the display portion; wherein
  the first connection portion is disposed on a back face of the display portion;
  the second connection portion is disposed on a side of the first connection portion facing away from the display portion;
  the driving chip is in bonding connection with the display panel in the first connection portion;
  the flexible circuit board is in bonding connection with the display panel in the second connection portion;
  the driving chip is disposed on a side of the first connection portion facing away from the display portion; and
  the flexible circuit board is disposed on a side of the driving chip facing away from the display portion;
  the display panel comprises:
    a flexible substrate; and
    at least one insulating layer and at least one metal layer which are disposed on the flexible substrate;
    wherein
      the at least one insulating layer and the at least one metal layer both have no pattern in the first bending portion and the second bending portion;
      the flexible substrate comprises a first flexible substrate layer, a base metal layer and a second flexible substrate layer which are sequentially disposed in stack; and
      the at least one metal layer is coupled with the base metal layer through a via hole running through the at least one insulating layer.

2. The display apparatus according to claim 1, wherein the flexible substrate further comprises a supporting layer disposed on a side of the second flexible substrate layer facing away from the first flexible substrate layer.

3. The display apparatus according to claim 2, wherein the display panel is provided with a groove structure with a channel running through the supporting layer both in the first bending portion and the second bending portion.

4. The display apparatus according to claim 1, wherein an element portion is provided on a side of the flexible circuit board facing away from the display portion, and the element portion is configured to be coupled with at least one element.

5. The display apparatus according to claim 4, further comprising:
  an adhesive between the first connection portion and the flexible circuit board;
  wherein the adhesive is disposed around the driving chip.

6. The display apparatus according to claim 5, wherein an orthographic projection of the driving chip on the display portion overlaps an orthographic projection of the element portion on the display portion; and
  in a direction from the first connection portion to the element portion, a thickness of the adhesive is greater than a height of the driving chip.

7. The display apparatus according to claim 5, wherein an orthographic projection of the driving chip on the display portion does not overlap an orthographic projection of the element portion on the display portion; and
  the element portion is disposed on a side of the driving chip facing away from the second connection portion.

8. The display apparatus according to claim 7, in a direction from the first connection portion to the flexible circuit board, the flexible circuit board further comprises:
  an open hole running through a thickness direction;
  wherein the open hole is used for accommodating the driving chip.

9. The display apparatus according to claim 8, wherein in the direction from the first connection portion to the flexible circuit board, a thickness of the adhesive is smaller than a height of the driving chip; and the height of the driving chip is smaller than a depth of the open hole.

10. A manufacturing method of the display apparatus according to claim 1, comprising:

connecting a driving chip with a display panel in a bonding mode via a first connection portion;

connecting a flexible circuit board with the display panel in a bonding mode via a second connection portion;

bringing the first connection portion, a second bending portion and the second connection portion to a back face of a display portion by bending in a first bending portion; and bringing the second connection portion to a side of the first connection portion facing away from the display portion by bending in the second bending portion.

11. The display apparatus according to claim 1, further comprising:

a back film disposed on a back face of the display portion, a back face of the first connection portion and a back face of the second connection portion.

12. The display apparatus according to claim 11, further comprising:

a cooling fin disposed on a side of the back film facing away from the display portion.

13. The display apparatus according to claim 12, further comprising:

a double-sided adhesive disposed on a side of the cooling fin facing away from the display portion;

wherein the double-sided adhesive is located between the cooling fin and the back film on the back face of the first connection portion.

14. The display apparatus according to claim 13, further comprising:

a polarizer disposed on a front face of the display portion.

15. The display apparatus according to claim 14, further comprising:

an adhesive material layer and a cover plate sequentially disposed on a side of the polarizer facing away from the display panel.

* * * * *